United States Patent [19]

Houston

[11] Patent Number: 5,376,846
[45] Date of Patent: Dec. 27, 1994

[54] TEMPERATURE COMPENSATION CIRCUIT AND METHOD OF OPERATION

[75] Inventor: Theodore W. Houston, Richardson, Tex.

[73] Assignee: Texas Instruments Incorporated, Dallas, Tex.

[21] Appl. No.: 184,746

[22] Filed: Jan. 21, 1994

Related U.S. Application Data

[63] Continuation of Ser. No. 837,200, Feb. 14, 1992, abandoned.

[51] Int. Cl.$^5$ .............................................. H03F 1/30
[52] U.S. Cl. ..................................... 327/513; 327/512; 327/378; 327/108; 326/68; 326/32
[58] Field of Search ............... 307/246, 263, 270, 310, 307/443, 591, 475, 491, 570, 571, 572, 576

[56] References Cited

U.S. PATENT DOCUMENTS

| | | | |
|---|---|---|---|
| 3,701,004 | 10/1972 | Tuccinardi et al. | 307/310 |
| 3,809,929 | 5/1974 | Vittoz | 307/310 |
| 4,622,476 | 11/1986 | Venkatesh | 307/310 |
| 4,795,918 | 1/1989 | Menon et al. | 307/310 |
| 4,924,112 | 5/1990 | Anderson et al. | 307/270 |
| 4,924,116 | 5/1990 | Vu et al. | 307/448 |
| 4,943,737 | 7/1990 | Guo et al. | 307/296.7 |
| 5,015,888 | 5/1991 | Ovens | 307/475 |
| 5,153,465 | 10/1992 | Sandhu | 307/475 |

FOREIGN PATENT DOCUMENTS

| | | | |
|---|---|---|---|
| 2844737 | 4/1979 | Germany | 307/310 |
| 0002388 | 1/1977 | Japan | 307/310 |
| 0101346 | 8/1979 | Japan | 307/310 |
| 0155712 | 6/1989 | Japan | 307/310 |

OTHER PUBLICATIONS

Trainor, Western Electric—Technical Digest No. 2, "Expanded Scale Voltmeter", Apr. 1966, pp. 27-28.

*Primary Examiner*—Timothy P. Callahan
*Assistant Examiner*—Terry D. Cunningham
*Attorney, Agent, or Firm*—Peter Rutkowski; Richard Donaldson; William E. Hiller

[57] ABSTRACT

A temperature compensation circuit (54 and 56, FIG. 3) is disclosed for maintaining the voltage at a first node. The amount of time the voltage at the first node is maintained is dependent upon the temperature of a temperature sensitive element (96). The circuit comprises a bleed-off transistor (86) and at least one temperature sensitive element (97). The first terminal (90) of the bleed-off transistor (86) is coupled to the first node and the second terminal (88) is coupled to a first voltage level. The control electrode (92) of the bleed-off transistor (86) is coupled to the first terminal (94) of the temperature sensitive element (96). The other pole of the element is coupled to a second voltage level. The element is operable to generate a voltage drop across its poles dependent upon its temperature.

13 Claims, 3 Drawing Sheets

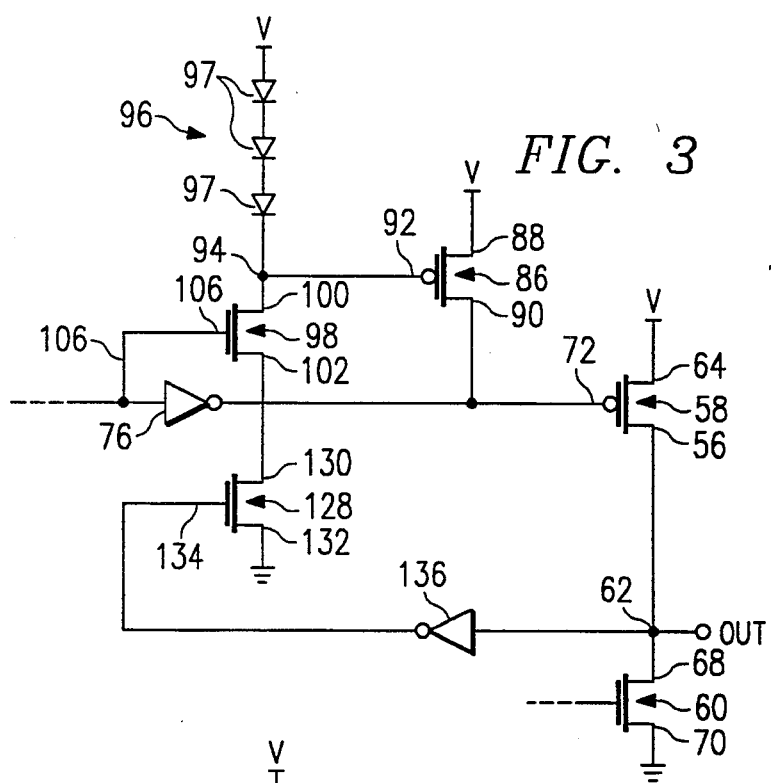
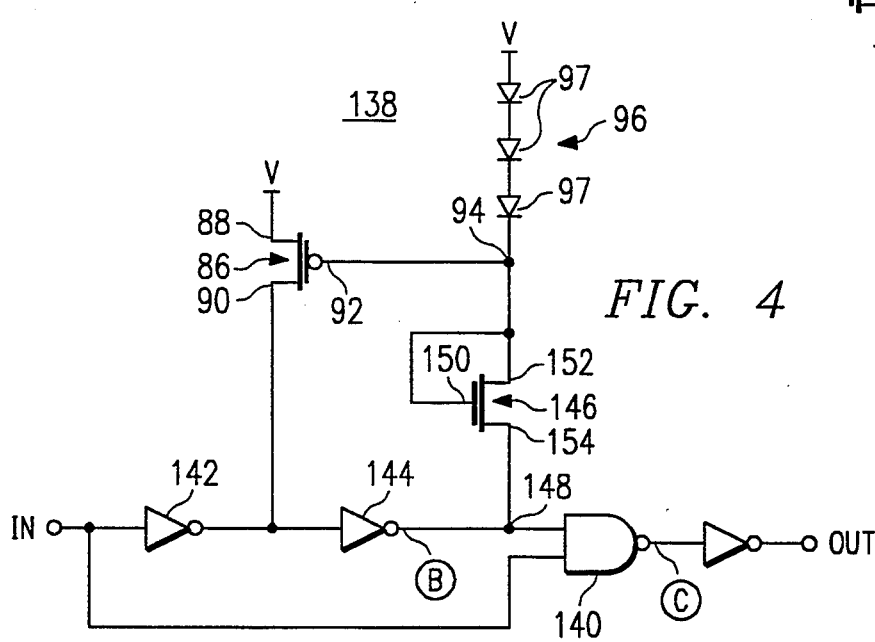
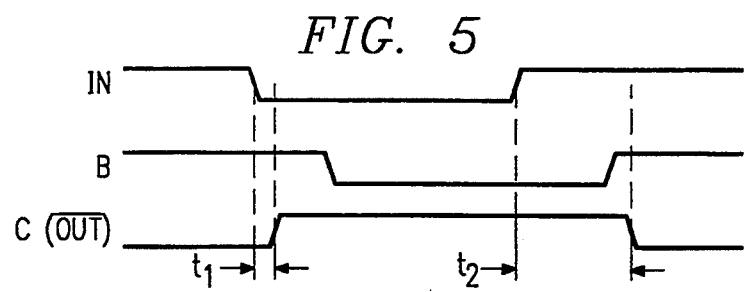

TEMPERATURE COMPENSATION CIRCUIT AND METHOD OF OPERATION

This invention was made with government support under contract No. 001-86-C-0090 awarded by the United States Defense Nuclear Agency. The Government may have certain rights in this invention.

This application is a continuation of application Ser. No. 07/837,200, filed Feb. 14, 1992 now abandoned.

TECHNICAL FIELD OF THE INVENTION

This invention relates in general to the field of metal oxide semiconductor circuits and, more particularly, to a temperature compensation circuit and method of operation.

BACKGROUND OF THE INVENTION

Metal oxide semiconductor ("MOS") circuits and complementary metal oxide semiconductor ("CMOS") circuits have operating characteristics which are strongly dependent upon temperature. In particular, the conductance of a MOS or of a CMOS field effect transistor ("FET") decreases with increasing temperature. As a result of this variation, circuit performance must sometimes be reduced to keep a circuit functional over a reasonable temperature range. FET performance is generally reduced so that the transistor will not over-conduct in the low temperature domain. This compromise results in a less capable circuit given a particular level of technology. In most instances, a circuit designed to operate over a wide temperature range simply does not switch as fast as a circuit designed to operate over a narrow temperature range.

Over-conductance in FET circuits causes a momentarily high rate of current change per unit time through the FET when the FET turns on. This change, when coupled with the inherent inductance of a circuit, causes an induced electromotive force ("EMF") which opposes the flow of current. This induced EMF will create noise in the voltage supply and ground plane. This in turn may cause various errors known in the art such as clock cycle failure.

Therefore, a need has arisen for a circuit for MOS and CMOS applications which is able to compensate for temperature induced conductance variation.

SUMMARY OF THE INVENTION

In accordance with the present invention, a temperature compensation circuit is provided which substantially eliminates or reduces disadvantages and problems associated with prior CMOS and MOS circuits.

A temperature compensation circuit is disclosed for modifying the temperature dependence of the net current to a first node. The circuit comprises a bleed-off transistor coupled between a power supply and the first node. The gate of the bleed-off transistor itself is coupled to a second node. The voltage of the second node and hence the conductance of the bleed-off transistor is controlled by a temperature sensitive element coupled to the second node.

The first technical advantage of the disclosed invention is its ability to compensate MOS and CMOS FET performance as a function of temperature. FETs may thus be operated with uniform performance throughout a wide temperature range.

A second technical advantage of the disclosed invention is the number of components involved. As few as one transistor and a set of resistors or diodes may be used to compensate a given circuit for the effects of temperature. As a consequence, overall circuit size and cost is minimized.

Another technical advantage of the disclosed invention is its versatility. The circuit may be easily incorporated into systems requiring temperature independent time delays. For example, an asymmetrical delay circuit may be constructed wherein the delay is temperature independent and is controlled by the disclosed invention.

BRIEF DESCRIPTION OF THE DRAWINGS

For a more complete understanding of the present invention and the advantages thereof, reference is now made to the following description taken in conjunction with the accompanying drawings in which:

FIG. 3 is a schematic electrical circuit diagram of a second embodiment of the disclosed invention for use in the output buffer depicted in FIG. 2;

FIG. 4 is a schematic electrical circuit diagram of an asymmetric delay circuit incorporating the disclosed invention; and FIG. 5 is a timing diagram of the operation of the circuit depicted in FIG. 4.

DETAILED DESCRIPTION OF THE INVENTION

The preferred embodiment of the present invention and its advantages are best understood by referring to FIGS. 1-5 of the drawings, like numerals being used for like and corresponding parts of the various drawings.

Figure 1:
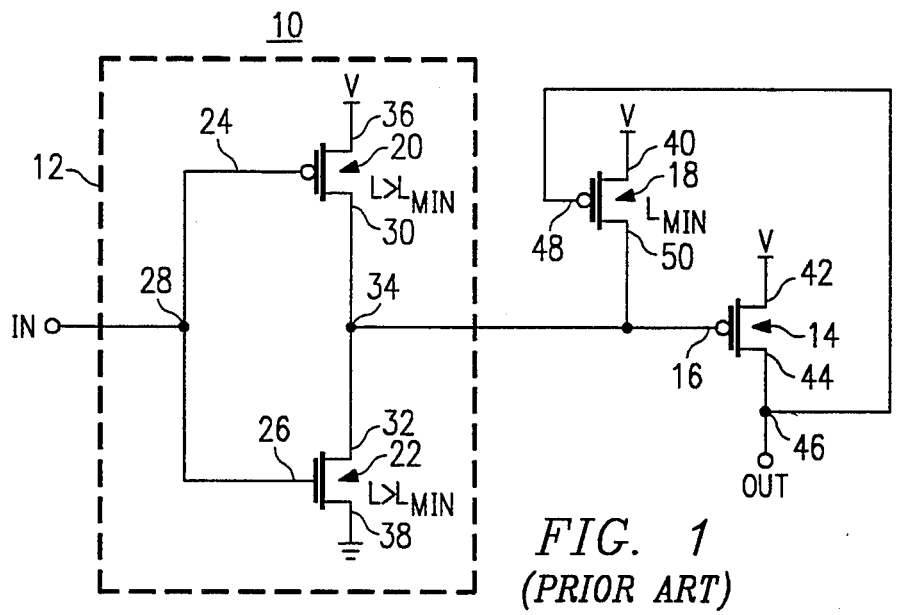
FIG. 1 is a schematic electrical circuit diagram of a gate length compensating circuit known in the art.

FIG. 1 depicts part of an output buffer 10, indicated generally at 10 with a gate length compensating circuit known in the art. Output buffer 10 has an inverter 12, shown by the dashed enclosure, driving an output transistor 14. Output transistor 14 has a gate 16 whose voltage is controlled in part by bleed-off transistor 18 as will be more fully described below. Inverter 12 comprises a p-channel transistor 20 and an n-channel transistor 22. Gates 24 and 26 of transistors 20 and 22 are coupled together at node 28 which acts as the input of output buffer 10. The drain 30 of transistor 20 and the drain 32 of transistor 22 are coupled together at node 34. Node 34 is connected to gate 16. A source 36 of transistor 20 is coupled to a voltage supply source, V, while a source 38 of transistor 22 is connected to a second voltage supply substantially lower than V, such as ground. As depicted, sources 40 and 42 of bleed-off transistor 18 and output transistor 14, respectively, are coupled to a voltage supply source, V. The drain 44 of output transistor 14 is connected to node 46 which acts as the output of buffer 10. Node 46 is also connected to the gate 48 of bleed-off transistor 18. The drain 50 of bleed-off transistor 18 is connected to node 34 and gate 16 of output transistor 14. In the particular embodiment of output buffer 10, bleed-off transistor 18 is a p-channel transistor.

In steady-state operation, output buffer 10 operates conventionally. In particular, a high input results in output transistor 14 sourcing current at node 46 while a low input causes output transistor 14 not to source current at node 46.

The conductance of transistors 14, 20, and 22 however vary as a function of the gate length of each of the transistors. This manufacturing variation in turn causes the performance of output buffer 10 to vary between identically designed output buffers. One result of gate length variation is that output transistor 14 may be turned on too quickly if one or more of the gates of transistors 14 and 20, is too short. As described above, a high rate of change of current through output transistor 14 can cause noise in the system voltage supply, V.

As is known in the art, bleed-off transistor 18 may be added to output buffer 10 to suppress rapid voltage changes on gate 16. Bleed-off transistor 18 is intentionally fabricated with a gate whose physical length, $L_{MIN}$, is shorter than the physical length of gates 24 and 26 of transistors 20 and 22. Typically, $L_{MIN}$ is the minimum gate length supported by the technology. This difference causes transistor 18 to be more sensitive to uncontrolled manufacturing variations. In particular, gate length variation is typically a uniform delta in length rather than a percentage of the intended gate length. This type of variation causes a greater percentage variation in the smaller gate 48. Therefore, bleed-off transistor 18 will have a greater percentage increase in conductance than either transistors 20 or 22 if fabrication errors result in generally shorter gates. Similarly, bleed-off transistor 18 will have greater percentage decrease in conductance than either transistor 20 or 22 if fabrication errors result in generally longer gates. Bleed-off transistor 18 will therefore supply a varying amount of current to gate 16 when the input to output buffer 10 switches from high to low. The amount of current depends on the gate length variation. This bleed-off current will counteract a portion of the drive current of transistor 22 at gate 16 to avoid turning transistor 14 on too quickly. The amount of source current depends on the manufacturing variation. Bleed-off transistor 18 is able to act as a compensating device because, by design, it is more sensitive to gate length variation than either transistor 14 or 20.

The gate length compensating circuit depicted in FIG. 1 does not give optimum compensation for variation of drive current with variation in temperature.

Figure 2:
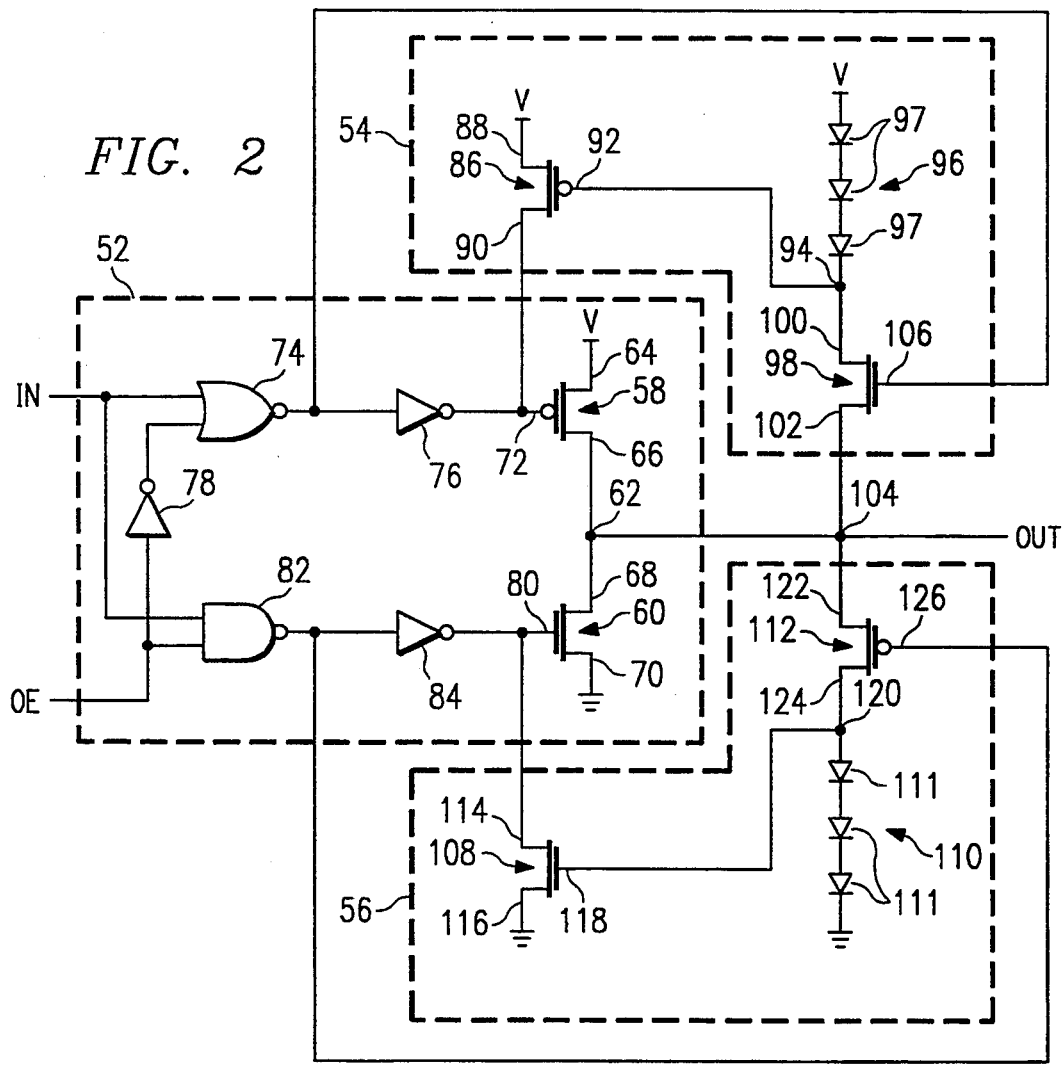
FIG. 2 is a schematic electrical circuit diagram of a first embodiment of the disclosed invention, as used in connection with an output buffer.

FIG. 2 depicts an output buffer and two temperature compensating circuits of the disclosed invention. The FIGURE depicts a circuit comprising an output buffer 52 having, primarily, a data input "IN", an output enable input "OE", and an output "OUT". Output buffer 52 has associated with it two temperature compensating circuits 54 and 56. Output buffer 52 and temperature compensating circuits 54 and 56 are indicated by dashed enclosures. These circuits modify the performance of output buffer 52 to be relatively constant across a wide temperature range.

Output buffer 52 comprises a p-channel output transistor 58 and an n-channel output transistor 60 which source or sink current to or from the output through node 62. Output transistor 58 has its source 64 coupled to a voltage supply, V, and its drain 66 coupled to output node 62. Conversely, the drain 68 of output transistor 60 is coupled to node 62 while source 70 is connected to a second voltage supply significantly lower than V, such as ground. The gate 72 of output transistor 58 is driven by NOR gate 74 through inverter 76. NOR gate 74 combines the logic levels on the IN and OE lines according to known methods. The data level present on the OE line is inverted by inverter 78 before reaching NOR gate 74. The gate 80 of output transistor 60 is controlled by the output of NAND gate 82 through inverter 84. NAND gate 82 combines the data levels present on the IN and OE lines according to known methods.

Temperature compensating circuit 54 comprises a p-channel bleed-off transistor 86 with its source 88 coupled to a voltage supply, V, and its drain 90 coupled to the gate 72 of output transistor 58. The gate 92 of bleed-off transistor 86 is connected to node 94. Node 94 is connected to a voltage supply, V, through a temperature sensitive element indicated generally at 96. Here, temperature sensitive element 96 comprises three diodes 97 biased as depicted. Temperature compensating circuitry 54 may also comprise an n-channel control transistor 98. The drain 100 of control transistor 98 is connected to node 94 while the source 102 is connected to node 104. Node 104 is coupled to node 62 and thus the output of output buffer 10. The gate 106 of control transistor 98 is coupled to the output of NOR gate 74.

Temperature compensating circuit 56 also comprises a bleed-off transistor 108, temperature sensitive element 110, and, if desired, control transistor 112. As depicted, the drain 114 of bleed-off transistor 108 is coupled to gate 80 of output transistor 60 while the source 116 is coupled to ground. The gate 118 of bleed-off transistor 108 is coupled to node 120. Node 120 is coupled to ground through temperature sensitive element 110. The source 122 of control transistor 112 is coupled to node 104 while the drain 124 is coupled to node 120. The gate 126 of control transistor 112 is coupled to the output of NAND gate 82. Here, temperature sensitive element 110 comprises three diodes 111 biased as depicted.

The output buffer 52 depicted in FIG. 2 operates in a conventional manner in steady-state conditions. In particular, node 62 is isolated when the output enable 0E is a logic zero. Otherwise, the output will be the logic inverse of the input. Unfortunately, the performance of output buffer 52 without the temperature compensation circuits 54 and 56 will vary according to temperature. As described above, output transistors 58 and 60 and inverters 76 and 84 will have a greater conductance at lower temperatures than at higher temperatures. This will affect the rate of change of current through the output transistors when the output logic level is changed. This will in turn affect the voltage supply, V, and ground plane where the logic state of the output buffer is switched. Specifically, there will be greater disturbances of the voltage at low temperature. Temperature compensating circuits 54 and 56, however, cause output buffer 52 to perform more uniformly with respect to temperature.

Temperature compensating circuits 54 and 56 each prevent one of the two output transistors 58 and 60 from turning on too quickly when temperatures are low. Temperature compensating circuit 54 sources a varying amount of current to gate 72 of p-channel output transistor 58. This prevents output transistor 58 from turning on too quickly. Conversely, temperature compensating circuit 56 sinks a varying amount of current from gate 80 of n-channel output transistor 60. This prevents output transistor 60 from turning on too quickly. The amount that each temperature compensating circuit sources or sinks depends in part upon the voltage at nodes 94 and 120 respectively. The voltage at each one of these nodes is dependant upon the physical characteristics of temperature sensitive elements 96 and 110, here three diodes. For a given current, PN junction diodes create a larger voltage drop across their two terminals at lower temperatures than at higher temperatures. As a result, as the temperature decreases, the voltage drop across temperature sensitive elements 96 and 110 increases.

In the case of temperature compensating circuit 54, the voltage at node 94 will decrease as temperature decreases. This decrease will cause the voltage between gate 92 and source 88 of bleed-off transistor 86 to increase. Because bleed-off transistor 86 is a p-channel FET, more current will be sourced to gate 72 of output transistor 58. The additional current at gate 72 will cause output transistor 58 to transistor from high to low more slowly than without temperature compensating circuit 54. This slow down will prevent output transistor 58 from turning on too quickly, reducing the induced EMF.

In the case of temperature compensating circuit 56, the voltage at node 120 will increase as temperature decreases. This increase will cause the voltage between gate 118 and source 116 of bleed-off transistor 108 to increase. Because bleed-off transistor 108 is an n-channel FET, more current will be sunk from gate 80 of output transistor 60 at low temperatures. This drain of current from gate 80 of output transistor 60 will cause it to rise in voltage more slowly. This slow down will prevent output transistor 60 from switching on too fast and causing the problems described above.

The connection of the sources of control transistors 98 and 112 to output node 104 turns off bleed-off transistors 86 and 108 once the steady state condition is reached. They may be connected to a fixed voltage where power consumption is not critical. Alternatively, a pair of control transistors may be added in series between bleed-off transistors 86 and 108 and their respective power supplies or between the bleed-off transistors and their respective output transistors. For example, a p-channel control transistor could be connected in series with source 88 of bleed-off transistor 86 and voltage supply V. The gate of this control transistor could be connected to node 104 to reduce the power consumption of the resultant circuit.

Figure 6:
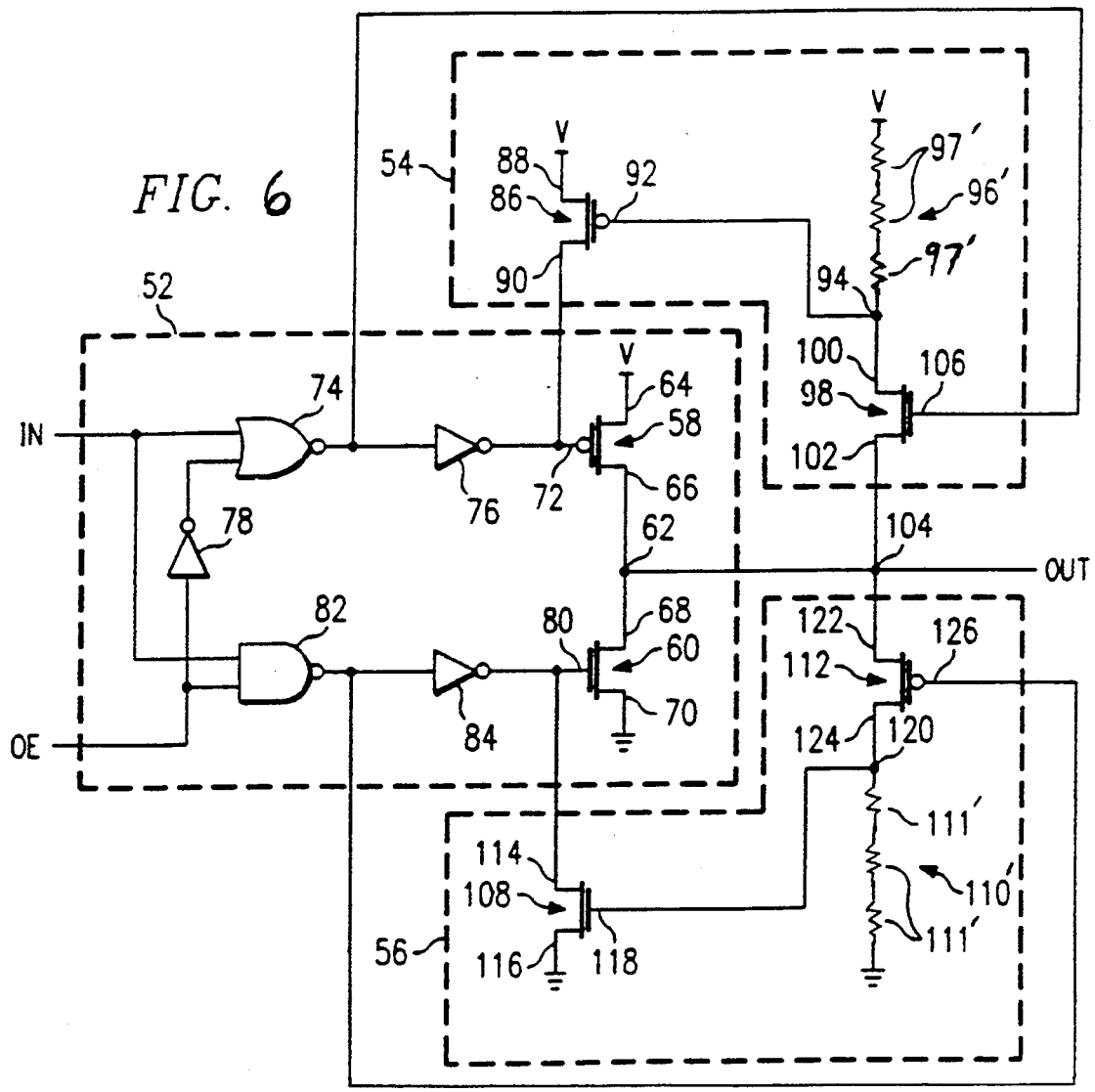
FIG. 6 is a schematic electrical circuit diagram of an alternate embodiment to the first embodiment of the disclosed invention.

Temperature sensitive elements 96 and 110 are depicted as diodes. Devices with either a positive or a negative temperature coefficient over the range of temperature of interest may be used. A device with a positive temperature coefficient is one whose resistance increases consistently with temperature. Metals are representative of such materials. A device with a negative temperature coefficient is one whose resistance decreases consistently with temperatures. Polysilicon is representative of such materials. Elements 96 and 110 need be monotonically increasing or decreasing only in the temperature range in which buffer 52 is intended to be operated. FIG. 2 depicts temperature compensating circuits 54 and 56 designed for use with a temperature sensitive device with a negative temperature coefficient. Diodes and resistors fabricated from polysilicon are representative of devices with negative temperature coefficients. FIG. 6 is an alternate embodiment of the output buffer with two temperature compensating circuits of FIG. 2 wherein the temperature compensating circuits 96' and 110' include resistive elements 97' and 111' respectively in place of diodes 97 and 111 of FIG. 2. If a device with positive temperature coefficient is instead selected, bleed-off transistor 86 must be replaced with an n-channel transistor. Similarly, bleed-off transistor 108 must be replaced with a p-channel transistor. In this case, other means will be needed to turn off the bleed-off transistor in the static condition.

Alternatively, the circuitry can be adapted so that the voltage of the gate of bleed-off transistor 86 is still higher at high temperature and lower at low temperature. In such a circuit, temperature sensitive element 96 connects node 94 to node 104. Control transistor 98 connects node 94 to voltage supply, V. The inverted output of NOR gate 74 controls the conductance of control transistor 98, a p-channel transistor. Similarly, temperature sensitive element 110 connects node 104 to node 120. Control transistor 112 connects node 120 to the voltage supply depicted as ground. The inverted output of NAND gate 82 controls the conductance of control transistor 112, an n-channel transistor.

The number or size of temperature sensitive elements may be adjusted to increase or decrease the sensitivity of temperature compensating circuits 54 and 56 to temperature. For instance, three diodes 97 or 111 produce approximately three times the voltage change per temperature change as would a single diode 97 or 111 at either location. It may be desired to adjust the parameters such that the transitions at nodes 72 and 80 are faster at high temperature than at low temperature (the opposite of the uncompensated circuit). This will compensate for the increased conductivity of output transistors 58 and 60 at low temperature.

The size of bleed-off transistors 86 and 108 and the respective gate voltages must be selected together so that the associated inverter can still cause a transition at the gates of transistors 58 and 60.

FIG. 3 depicts a second embodiment of the disclosed invention for use in a MOS circuit such as the output buffer depicted in FIG. 2. Only output transistors 58 and 60 and inverter 76 are repeated from the previous FIGURE. The rest of the buffer 52 is omitted for clarity. Here, control transistor 98 has been reconfigured to be connected to a second control transistor 128. Source 102 of control transistor 98 is connected to the drain 130 of second control transistor 128. The source 132 of second control transistor 128 is grounded while the gate 134 is coupled to output node 62 through inverter 136.

The circuit depicted in FIG. 3 performs as does temperature compensating circuit 54 described in connection with FIG. 2. However, the modified circuit minimizes loading to the output node thus reducing static power. Bleed-off transistor 86 is turned on by control transistor 98 immediately before output transistor 58 is turned on and is turned off by second control transistor 128 once the output voltage goes high. The configuration depicted in FIG. 3, while involving an additional transistor and logic gate, may be preferable in certain applications where output loading is critical.

It should be understood that a second control transistor may be added to temperature compensating circuit 56 (depicted in FIG. 2) in an analogous fashion. Specifically, a second p-channel transistor may be added in series between control transistor 112 and a positive voltage supply to control transistor 112. The gate of that second control transistor would be controlled by an inverter with input from node 62. This modification would serve to turn off bleed-off transistor 108 after the output had transitioned low. It should be understood that the present invention has been described within the context of an output buffer in which the output transistors are to be switched-on more slowly. Other implementations using the disclosed temperature sensitive element to control the gate voltage of a bleed-off transistor as well as for switching the element on and off will be apparent to one skilled in the art. Also, implementations using the disclosed circuitry to turn-off an output transistor more slowly are possible.

FIG. 4 depicts an asymmetric delay circuit indicated generally at 138 and incorporating the disclosed invention. Asymmetric delay circuit 138 is one of a class of devices that will propagate a signal transition with a different delay for a low to high transition versus a high to low transition. The shorter delay may be referred to as $t_1$, and the longer delay as $t_2$. The delay $t_2$ of a known asymmetric delay circuit varies as a function of circuit temperature. The lower the temperature of the circuit, the shorter the delay. Such performance may be undesirable in some situations. Circuit 138, however, compensates for the change in performance associated with varying temperatures.

A temperature independent asymmetric delay circuit is desirable in applications such as static random access memory ("SRAM") arrays. There, address lines and data lines need to be stable before an enable/write command may be given. An asymmetric delay can be used to introduce delay in enabling the write to allow time for address and data stabilization. Otherwise, soft memory errors are likely to occur. The time specified for the address lines to stabilize may be independent of temperature. This makes a circuit such as the one depicted on FIG. 4 helpful. An enable/write command may be delayed an amount of time independent of the temperature of the circuit.

Circuit 138 comprises a NAND gate 140 fed by an input signal "IN" and the same signal twice inverted by inverters 142 and 144. Node 143 electrically connects the output of inverter 142 to the input of inverter 144 and the drain 90 of bleed-off transistor 86. Bleed-off transistor 86 is connected in series between a voltage supply, V, and the input of inverter 144. Node 143 electrically connects the output of inverter 142, to the input of inverter 144, and drain 90 of bleed-off transistor 86. Gate 92 of bleed-off transistor 86 is controlled by the voltage at node 94. The voltage at node 94 is in turn dependent upon the voltage drop across temperature sensitive element 96 as described above. Transistor 146 is coupled in series between node 94 and node 148. The gate 150 and drain 152 of transistor 146 are coupled together and to node 94. The source 154 of transistor 146 is coupled to node 148. Transistor 146 acts as a non-linear resistor between node 94 and node 148. Circuitry could be added to eliminate static power dissipation as described in connection with FIG. 3.

In the case of asymmetric delay circuit 138, the second delay, $t_2$, is influenced by the temperature compensation circuitry. The higher the temperature of temperature sensitive element 96, the smaller the voltage drop across the elements 97. The smaller the voltage drop at node 94 the smaller the current conducted through bleed-off transistor 86 to node 143. Conversely, a lower temperature results in a higher voltage drop across elements 97. This results in a lower voltage at node 94 causing bleed-off transistor 86 to conduct more current to node 143. Bleed-off transistor 86 is thereby able to change the temperature dependency of $t_2$.

FIG. 5 is the timing diagram of the operation of the circuit depicted in FIG. 4, where the trace labeled "IN" represents the input, the trace labeled "B" represents the voltage level at the output of inverter 144 and the trace labeled "C ($\overline{OUT}$)" represents the output of NAND gate 140. This final trace is, of course, the inverse of the output, "OUT." Initially, the input to circuit 138 is high and C is low. After the uninverted input drops low and a delay $t_1$ elapses, the output of NAND 140 will switch to high. Delay $t_1$ is the time required for the switching of NAND gate 140. The delayed input to NAND gate 140, B, will remain high an amount of time necessary for both inverters 142 and 144 to switch states. At some later time, the input returns to its high state. The output of NAND gate 140 will switch low after both of its inputs switch high. Time $t_2$ is determined by the delay in switching inverters 142 and 144, which is affected by bleed-off transistor 86, and NAND gate 140. While bleed-off transistor 86 sources current to node 143, node 143 will transition low more slowly, depending on the magnitude of the bleed-off current and the drive of inverter 144. The magnitude of the bleed-off current that transistor 86 sources to inverter 144 is determined by the voltage at node 94 as described above. The circuitry can be adjusted to make delay $t_2$ particularly sensitive or insensitive to temperature variation, depending on the application.

Although the disclosed invention, as described in connection with FIGS. 1 through 5 discusses a generic positive voltage supply, V, the scope of the invention should not be construed to require a single uniform voltage level at each occurrence of V. Also, in transistor terminology, gate, source and drain may be replaced with control electrode and first and second terminals to reflect the bidirectional nature of the devices.

In summary, novel circuitry for the modification of temperature-dependent performance, and for the enhancement thereof, has been illustrated and described in connection with a particular output buffer and asymmetric delay circuit. The novel circuitry, however, can be applied to different configurations of buffers and delays and to other circuits such as pulse generators. In general, this approach to temperature compensation can be applied to modify the temperature dependence of the net current to any circuit node where a reduced temperature dependence of a delay path is desired. Although the present invention and its advantages have been described in detail, it should be understood that various changes, substitutions and alterations can be made herein without departing from the spirit and scope of the invention as defined by the appended claims. For instance, one skilled in the art may be able to connect other components in series between the bleed-off transistor and the temperature sensitive element and achieve the advantages of the disclosed invention.

What is claimed is:

1. A temperature compensation circuit for modifying a temperature dependence of a net current to a control electrode of a first transistor, the first transistor having first and second terminals defining a current path through the first transistor and a control electrode, the circuit comprising:

a bleed-off transistor having first and second terminals defining a current path through the bleed-off transistor and a control electrode, the first terminal of the bleed-off transistor coupled to the control electrode of the first transistor, the second terminal of the bleed-off transistor coupled to a supply of a first voltage level, and the control electrode of the bleed-off transistor coupled to a node;

at least one temperature sensitive element having first and second terminals defining a current path through the element, the first terminal coupled to said node and the second terminal coupled to a supply of a second voltage level, the element operable to generate a voltage drop across its terminals dependent upon its temperature;

a first control transistor having first and second terminals defining a current path through the first control transistor and a control electrode, the first terminal of the control transistor connected to said node, the control electrode of the first control transistor connected to said control electrode of said first transistor through a first inverter; and a second control transistor having first and second terminals defining a current path through the second control transistor and a control electrode, the first terminal of the second control transistor coupled to the second terminal of the first control transistor, the second terminal of the second control transistor coupled to a supply of a third voltage level, and the control electrode of the second control transistor coupled to the second terminal of the first transistor through a second inverter.

2. The circuit of claim 1 wherein the temperature sensitive element is selected from the group consisting of diodes and resistors wherein resistance of said diodes and resistors changes consistently with temperature.

3. The circuit of claim 2 wherein the temperature sensitive element comprises at least one p-n junction diode.

4. The circuit of claim 1 wherein the temperature sensitive element has a voltage drop which decreases as a function of increasing temperature.

5. The temperature compensation circuit of claim 1 wherein said first and second voltage levels are the same.

6. Temperature compensation circuit for reducing a temperature dependence of values of voltages at each of the control electrodes of a pair of CMOS transistors, the pair of CMOS transistors comprising a p-channel and an n-channel transistor, the circuitry comprising:

circuitry for driving the control electrodes of the pair of CMOS transistors in response to an input signal;

a first bleed-off transistor having a control electrode, a current path of said first bleed-off transistor coupling a supply of a first voltage level to said control electrode of the p-channel transistor;

a first temperature sensitive device having first and second opposed terminals, a voltage drop between said first and second terminals of said first temperature sensitive device varying with temperature, said first terminal of said first temperature sensitive device coupled to a supply of a second voltage level, said second terminal of said first temperature sensitive device coupled to said control electrode of said first bleed-off transistor;

a second bleed-off transistor having a control electrode, a current path of said second bleed-off transistor coupling a supply of a third voltage level to a gate of the n-channel transistor; and a second temperature sensitive device having first and second opposed terminals, a voltage drop between said first and second terminals of said second temperature sensitive device varying with temperature, said first teminal of said second temperature sensitive device coupled to a supply of a fourth voltage level, said second terminal of said second temperature sensitive device coupled to control electrode of said second bleed-off transistor;

said p-channel transistor having a current path which couples a supply of a fifth voltage level to an output node, said n-channel transistor having a current path which coupled a supply of a sixth voltage level to said output node.

7. The circuitry of claim 6 wherein the temperature sensitive devices each comprise at least one element selected from the group consisting of diodes and resistors wherein resistance of said diodes and resistors changes consistently with temperature.

8. The circuitry of claim 6 wherein at least one of the temperature sensitive devices has a voltage drop which decreases as a function of an increase in temperature.

9. The circuitry of claim 6 wherein said first and second bleed-off transistors are p-channel and n-channel transistors respectively.

10. The temperature compensation circuitry of claim 6 wherein said first, second and fifth voltage levels are the same and said third, fourth, and sixth voltage levels are the same.

11. An temperature compensated output buffer comprising:

an n-channel transistor having a control electrode and first and second terminals defining a current path therethrough, the first terminal coupled to a supply of a first voltage level, and the second terminal coupled to an output node;

a p-channel transistor having a control electrode and first and second terminals defining a current path therethrough, the first terminal coupled to the output node and the second terminal coupled to a supply of a second voltage level;

a first temperature compensating circuit including:

a first bleed-off transistor having first and second terminals defining a current path therethrough and a control electrode, the first terminal coupled to a supply of a third voltage level, the second terminal coupled to the control electrode of the p-channel transistor and the control electrode coupled to a first node;

a first temperature sensitive element having first and second terminals, the first terminal coupled to a supply of a fourth voltage level the second terminal coupled to the first node, the element operable to generate a decreasing voltage drop across its terminals with increasing temperature;

a first control transistor having first and second terminals defining a current path therethrough and a control electrode, the first terminal coupled to the first node, the second terminal coupled to the output node, the control electrode of said first control transistor coupled to the control electrode of the p-channel transistor through a first inverter;

a second temperature compensating circuit including:

a second bleed-off transistor having first and second terminals defining a current path therethrough and a control electrode, the first terminal coupled to a supply of a fifth voltage level, the second terminal coupled to the control electrode of the n-channel transistor, the control electrode coupled to a second node;

a second temperature sensitive element having first and second terminals, the first terminal coupled to a supply of a sixth voltage level, the second terminal coupled to the second node, the element operable to generate a decreasing voltage drop across its terminals with increasing temperature;

a second control transistor having first and second terminals defining a current path therethrough and a control electrode, the first terminal coupled to the second node, the second terminal coupled to the output node, the control electrode of said second control transistor coupled to the control electrode of said n-channel transistor through a second inverter; and switching circuitry for alternately switching an input logic level to one of the control electrodes of the n-channel or the p-channel transistors through one of the inverters, and alternately placing one of the control transistors in a conducting state.

12. The output buffer of claim 11 wherein each of said temperature compensating elements comprises at least one element selected from the group consisting of resistors and diodes wherein resistance of said diodes and resistors changes consistently with temperature.

13. The temperature compensated output buffer of claim 11 wherein said first, fifth and sixth voltage levels are the same and said second, third and fourth voltage levels are the same.

* * * * *